United States Patent
Leuschner (10) Patent No.: US 6,704,220 B2
(45) Date of Patent: Mar. 9, 2004

(54) LAYOUT FOR THERMALLY SELECTED CROSS-POINT MRAM CELL

(75) Inventor: Rainer Leuschner, Mohegan Lake, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/138,396

(22) Filed: May 3, 2002

(65) Prior Publication Data

US 2003/0206434 A1 Nov. 6, 2003

(51) Int. Cl.$^7$ ............................................... G11C 11/15
(52) U.S. Cl. ........................ 365/173; 365/66; 365/69; 365/98; 365/209; 365/59
(58) Field of Search ........................... 365/173, 66, 98, 365/209, 59, 69

(56) References Cited

U.S. PATENT DOCUMENTS

| | | | |
|---|---|---|---|
| 5,969,978 A | * 10/1999 | Prinz | ........................ 365/98 |
| 6,363,000 B2 | * 3/2002 | Perner et al. | ................. 365/66 |
| 6,385,082 B1 | 5/2002 | Abraham et al. | |
| 6,404,673 B1 | * 6/2002 | Matsui | ...................... 365/173 |
| 6,538,919 B1 | 3/2003 | Abraham et al. | |

\* cited by examiner

*Primary Examiner*—Connie C. Yoha
(74) *Attorney, Agent, or Firm*—Slater & Matsil, L.L.P.

(57) ABSTRACT

A resistive memory device (40) and method of manufacturing thereof including magnetic memory cells (14) having a second magnetic layer (20) including at least a first and second material (24/26). The Curie temperature of the second material (26) is lower than the Curie temperature of the first material (24). A plurality of non-continuous second conductive lines (22) are disposed over the magnetic memory cells (14). A current (28) may be run through the second conductive lines (22) to increase the temperature of the second material (26) to a temperature greater than the second material (26) Curie temperature, causing the second material (26) to lose its ferromagnetic properties, providing increased write selectivity to the memory array (40).

20 Claims, 4 Drawing Sheets

LAYOUT FOR THERMALLY SELECTED CROSS-POINT MRAM CELL

CROSS-REFERENCE TO RELATED APPLICATIONS

This invention is related to U.S. patent application Ser. No. 10/124,950, entitled "Material Combinations for Tunnel Junction Cap Layer, Tunnel Junction Hard Mask and Tunnel Junction Stack Seed Layer in MRAM processing," filed on Apr. 18, 2002 by Leuschner, et al., which is incorporated herein by reference.

TECHNICAL FIELD

The present invention relates generally to the fabrication of semiconductor devices, and more particularly to the fabrication of magnetic random access memory (MRAM) devices.

BACKGROUND OF THE INVENTION

Semiconductors are widely used for integrated circuits for electronic applications, including radios, televisions, cell phones, and personal computing devices, as examples. One type of semiconductor device is a semiconductor storage device, such as a dynamic random access memory (DRAM) and flash memory, which use a charge to store information.

Spin electronics combines semiconductor technology and magnetics, and is a more recent development in memory devices. In spin electronics, the spin of an electron, rather than the charge, is used to indicate the presence of a "1" or "0". One such spin electronic device is an MRAM device, which includes conductive lines positioned in different directions to one another in different metal layers, the conductive lines sandwiching a magnetic stack or magnetic memory cell. The place where the conductive lines, e.g., wordlines and bitlines, intersect is called a cross-point. A current flowing through one of the conductive lines generates a magnetic field around the conductive line and orients the magnetic polarity into a certain direction along the wire or conductive line. A current flowing through the other conductive line induces a magnetic field and can partially turn the magnetic polarity, also. Digital information, represented as a "0" or "1", is storable in the alignment of magnetic moments. The resistance of the magnetic component depends on the moment's alignment. The stored state may be read from the element by detecting the component's resistive state.

A memory cell array is generally constructed by placing the conductive lines and cross-points in a matrix structure having rows and columns. Information is stored in the soft magnetic layer or free layer of magnetic stacks. To store the information, a magnetic field is necessary. This magnetic field is provided by a wordline and bitline current which is passed through the conductive lines. The information is read by applying a voltage to the particular cell to be read, and determining the resistance value of the cell, which indicates a "1" or "0" logic state.

An advantage of MRAM devices compared to traditional semiconductor memory devices such as DRAM devices is that MRAM devices are non-volatile. For example, a personal computer (PC) utilizing MRAM devices would not have a long "boot-up" time as with conventional PCs that utilize DRAM devices. Also, an MRAM device does not need to be powered up and has the capability of "remembering" the stored data. MRAM devices have the potential to eliminate the boot up process, store more data, access that data faster and use less power than current memory technologies.

In the manufacturing of MRAM devices, typically, a memory cell typically comprises a magnetic stack including a plurality of metals with a thin layer of dielectric therebetween. The magnetic stack may have a total thickness of a few tens of nanometers, for example. For cross-point MRAM structures, the magnetic stack is usually located at the intersection of two metal wiring levels, for example, at the intersection of metal 2 (M2) and metal 3 (M3) layers that run in different directions positioned at an angle to one another. The tops and bottoms of the magnetic stacks typically contact the M(n) and M(n+1) wiring layer conductive lines, respectively.

In a cross-point MRAM devices, the magnetic tunnel junction (MTJ) cells are located at the cross-points of first and second conductive lines, e.g., wordlines and bitlines. The wordlines and bitlines create a magnetic field when a write current is passed through them. The MTJ cells include a hard or reference layer comprised of one or more magnetic layers, an insulating layer referred to as a tunnel barrier or tunnel junction, which has resistive properties, and a free or soft layer, also comprised of one or more magnetic layers. The magnetic fields from both the wordline and bitline add up, resulting in switching the memory cell by changing the resistance of the tunnel barrier. In this manner, cells are selected for switching in a cross-point array.

A problem with prior art MRAM designs is that because a magnetic field is used to write the cells, there is a risk of switching undesired, for example, memory cells adjacent the targeted memory cell, due to inconsistencies in the magnetic material properties of the cells, for example. Also, any memory cell that is disposed over the same word or bit line as the selected cell sees a portion of the magnetic switching field and may be inadvertently switched, for example. Other causes of undesired switching of cells may include fluctuations in the magnetic field, or alterations in the shape of the field, as examples. Therefore, a write margin is desired for switching the cells without error.

An alternative cell selection concept that has been proposed in MRAM technology utilizes a field-producing current on the bit line and a heating current to reduce saturation magnetization for the selected cells. In this heated cell selection method, only the heated cells can be switched, improving the write margin and reducing the chances of unintended cells being written. For this thermal select concept, running a heat current from the wordline to the bitline through the tunnel junction has been proposed, using the tunnel junction basically as a heating resistor. However, the insulating material used for the tunnel barrier typically cannot withstand the high current passed through it in this scheme, resulting in damage to the tunnel junction and thus, destruction of the memory cell.

What is needed in the art is a reliable structure and method for thermally selecting magnetic memory cells of MRAM devices that does not damage the tunnel barrier.

SUMMARY OF THE INVENTION

Preferred embodiments of the present invention achieve technical advantages by providing an MRAM layout and thermal selection for memory cells wherein the memory cell free layer acts as a heat resistor. Wordlines with gaps over the centers of the memory cells are utilized to run a heat current to a row of memory cells, allowing the thermally selection of the heated row of memory cells. A cap layer may be disposed over each memory cell, wherein a portion of the heat current is adapted to be run through the cap layer to provide the write current for the hard axis field of the selected row of cells.

In one embodiment, a resistive semiconductor memory device is disclosed, comprising a plurality of first conductive lines running in a first direction, and a plurality of magnetic memory cells disposed over the first conductive lines. The resistive semiconductor memory device includes a plurality of second conductive lines running in a second direction disposed over the magnetic memory cells, the second direction being different from the first direction, wherein the second conductive lines are non-continuous.

In another embodiment, a method of fabricating a resistive semiconductor memory device is disclosed. The method includes providing a workpiece, disposing a plurality of first conductive lines over the workpiece, and forming a plurality of magnetic memory cells over the first conductive lines. Forming the magnetic memory cells includes forming a first magnetic layer over the first conductive lines, forming a tunnel barrier layer over the first magnetic layer, depositing a second magnetic layer first material over the tunnel barrier, and depositing a second magnetic layer second material over the second magnetic layer first material. The second magnetic layer second material has a lower Curie temperature than the Curie temperature of the second magnetic layer first material. The method includes forming a plurality of second conductive lines over the magnetic memory cells, wherein the second conductive lines are non-continuous and have gaps over central portions of the magnetic memory cells.

In another embodiment, a method of writing to an MRAM device is disclosed. The method includes providing an MRAM device having an array of magnetic memory cells disposed over a plurality of first conductive lines. The memory cells include a soft layer including a first magnetic material and a second magnetic material disposed over the first magnetic material, where the second magnetic material has a lower Curie temperature than the first magnetic material. The MRAM device includes a plurality of non-continuous second conductive lines disposed over the magnetic memory cells. According to an embodiment of the method, a heat current is run through at least a portion of one of the second conductive lines through the second magnetic material of at least one of the magnetic memory cells, wherein the heat current increases the temperature of the second magnetic material.

Advantages of embodiments of the invention include increasing the write margin of resistive memory devices. A row of memory cells may be thermally selected, using the soft or free layer as the resistive heating element. No additional wiring or material layers are necessary in accordance with embodiments of the invention. The heat current is applied to the row using the second conductive lines, e.g., wordlines disposed adjacent the soft layer. A cap layer may be disposed over the memory cells through which a portion of the current may be run, to provide the write current for the hard axis field of the magnetic memory cells. The required write currents for both wordlines and bitlines are reduced in accordance with embodiments of the invention.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

Some exemplary embodiments of the present invention and some advantages thereof will next be described.

Figure 1:
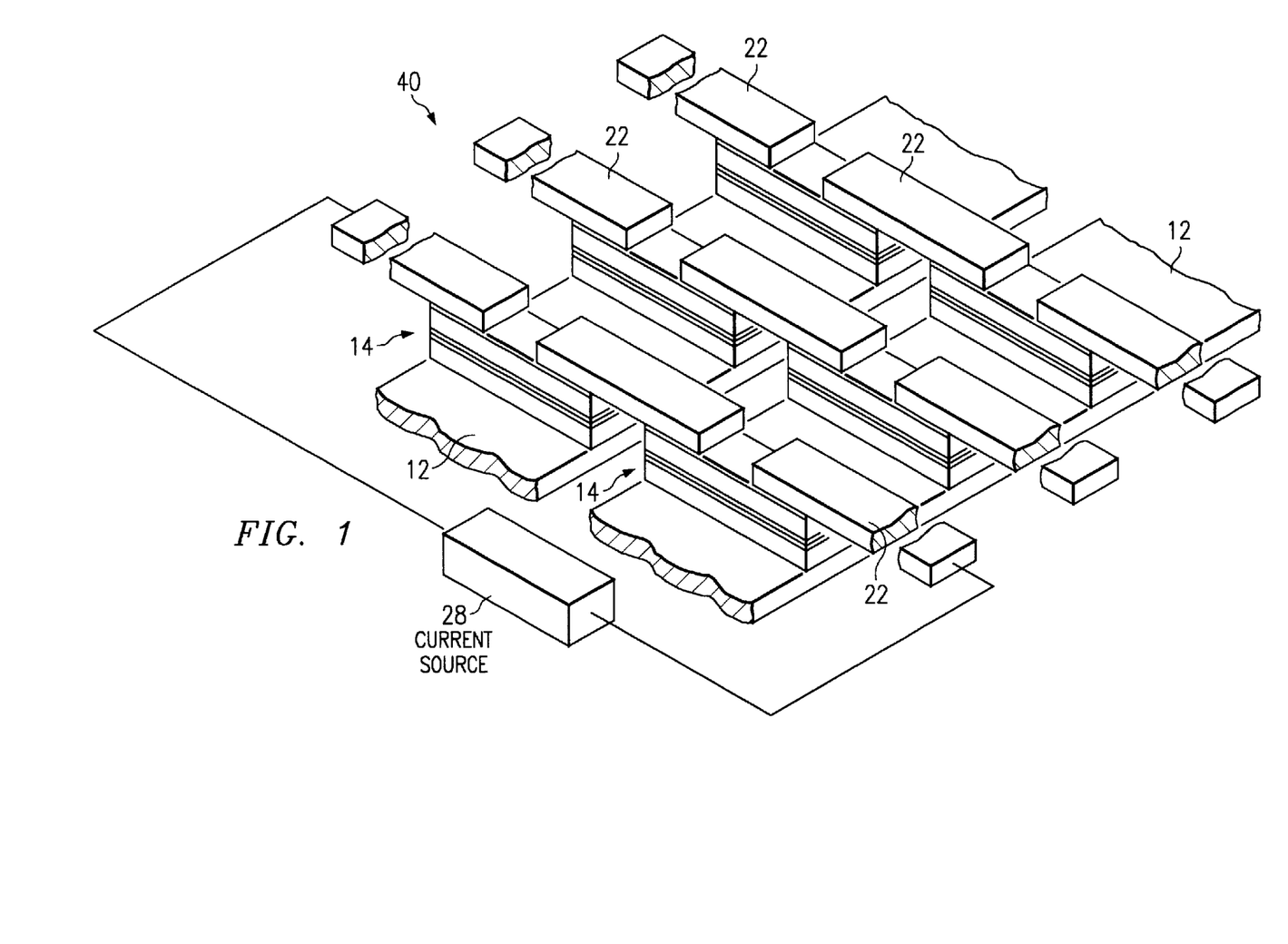
FIG. 1 illustrates a perspective view of an MRAM device having magnetic memory cells arranged in an array, with non-continuous second conductive lines disposed above each memory cell in accordance with an embodiment of the present invention.

An MRAM device 40 in accordance with a preferred embodiment of the present invention is shown in a perspective view in FIG. 1. A plurality of magnetic memory cells 14 comprising magnetic stacks, for example, are sandwiched between a plurality of first and second conductive lines 12 and 22 running in a first and second direction, respectively. The first and second conductive lines 12/22 preferably comprise a conductive material such as aluminum or copper, for example. A first inter-level dielectric (ILD) layer (not shown) is deposited over a workpiece (not shown). A metallization layer is formed, typically in the inter-level dielectric layer, using a damascene process to form the first conductive lines 12. A barrier layer comprising TaN or TiN, as examples, may be formed over the ILD layer, and a seed layer may be formed over the barrier layer, not shown. Magnetic memory cells 14 comprising magnetic stacks are formed in an array over the first conductive lines 12.

Figure 2:
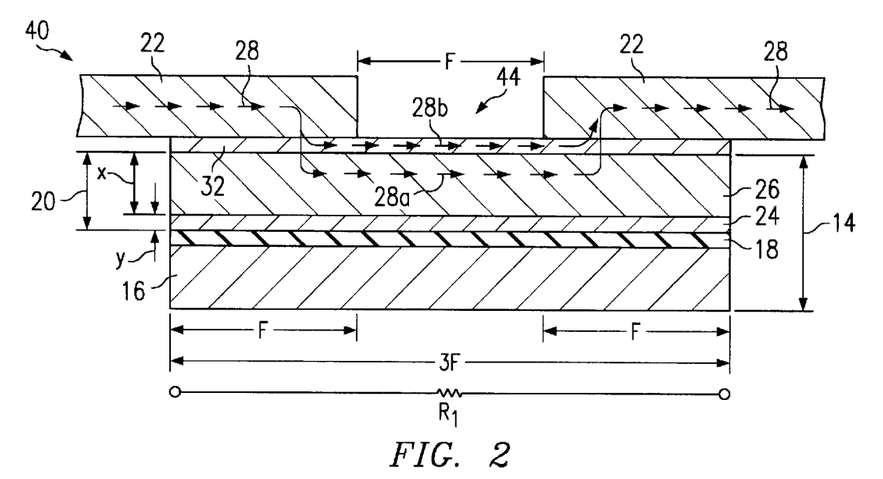
FIG. 2 shows a cross-sectional view of a magnetic memory element and non-conductive second conductive lines in accordance with embodiments of the invention.

Referring also now to FIG. 2, the magnetic memory cells 14 preferably comprise a first magnetic layer 16 including one or more of layers of materials such as PtMn, CoFe, Ru, and NiFe, for example. The first magnetic layer 16 is also referred to herein as a hard layer or reference layer. The first magnetic layer 16 may include a seed layer disposed over the first conductive lines 12, not shown. The seed layer may comprise TaN, for example, to prevent corrosion of the first conductive lines 12 during the etching of the magnetic memory cells 14.

The magnetic memory cells 14 also include a dielectric layer 18, comprising $Al_2O_3$, for example, deposited over the first magnetic layer 16. The dielectric layer 18 is also referred to herein as a tunnel layer, tunnel barrier or T-barrier. The magnetic memory cells 14 also include a second magnetic layer 20 disposed over the dielectric layer 18. The second magnetic layer 20 is also referred to herein as a soft layer or free layer. In accordance with an embodiment of the invention, the second magnetic layer 20 preferably comprises two or more layers 24 and 26, to be described further herein. The first magnetic layer 16, dielectric layer 18 and second magnetic layer 20 are patterned to form magnetic memory cells or elements 14. Magnetic memory cells 14 may comprise a substantially rectangular shape, and may alternatively comprise other shapes, such as a circle, square, or ellipse, as an example.

In accordance with embodiments of the invention, non-continuous second conductive lines 22 are disposed over the magnetic memory cells 14. The non-continuous second conductive lines 22 may be part of a metallization layer and preferably are patterned to run in a different direction than, e.g., substantially perpendicular to, the first conductive lines 12. The non-continuous second conductive lines 22 may be formed using a damascene process, within a dielectric layer (not shown) deposited over the magnetic memory elements 14 and second conductive lines 22, or alternatively, the second conductive lines 22 may be formed in a non-damascene process, as examples.

First and second conductive lines 12 and 22 are adapted to function as the bitlines and wordlines of the memory array 10. The order of the magnetic memory cell 14 layers may be reversed, e.g., the hard layer 16 may be on the top and the soft layer 20 may be on the bottom of the insulating layer 18, for example. Similarly, the bitlines 12 and wordlines 22 may be disposed either above or below the magnetic memory cells 14. However, preferably, the non-continuous conductive lines 22 are electrically coupled to the soft layer 20 of the magnetic memory cells 14, to be discussed further herein.

In accordance with embodiments of the invention, preferably the second conductive lines 22 are non-continuous, as shown in FIG. 1. In particular, the second conductive lines 22 preferably include a gap 44 over a center portion of each magnetic memory cell 14, as shown in a cross-sectional view in FIG. 2. Each second conductive line 22 is preferably patterned into a plurality of strips, to connect adjacent magnetic memory cells 14. A heat current source 28 may be coupled across any of the second conductive lines 22, as shown in FIG. 1. A current source for the write current, not shown, may be coupled across any of the first conductive lines 12.

Referring to FIG. 2, the magnetic memory cells 14 include a first magnetic layer 16 disposed over the first conductive lines 12 (see FIG. 1), a tunnel barrier 18 disposed over the first magnetic layer 16, and a second magnetic layer 20 is disposed over the tunnel barrier 18. In accordance with embodiments of the invention, the second magnetic layer comprises a first material 24 and a second material 26 disposed over the first material 24. The second material 26 preferably has a lower Curie temperature than the Curie temperature of the first material 24. For example, the second material 26 may have a Curie temperature of from room temperature up to about 400 degrees C., while the first material 24 may have a Curie temperature of greater than 420 degrees C., as examples. The second magnetic layer 20 may also include a third material disposed between the first and second materials 24/26, to be discussed further herein with reference to FIG. 8.

Preferably, the first material 24 comprises a magnetic material having a thickness "y" and the second material 26 comprises a magnetic material having a thickness "x", where x>y. Preferably, x is at least five times greater than y, and more preferably, x is ten times greater than y, as examples.

Preferably, the magnetic memory cell 14 has a shape anisotropy such that the "easy" (e.g. easy to switch or write) axis of the magnetic element 14 is perpendicular to the bitline 12 and parallel to the wordline 22 direction. To obtain a reasonable shape anisotropy, preferably an aspect ratio of three or more is used, such that the cell 14 is long in the wordline or second conductive line 22 direction.

In accordance with embodiments of the invention, the minimum printable dimension F is the width of the cell 14 (where the width is along the shortest side of the cell 14), and the cell 14 has an aspect ratio of three or more, e.g., the length of the cell 14 is 3F or greater. With an aspect ratio of three or more, it is possible to pattern a gap 44 into the word line (which gap 44 is preferably above the MTJ cell) substantially in the middle of the cell 14, as shown in FIG. 2. Preferably the gap 44 is substantially the width of the minimum feature size F. Also, preferably, the second conductive lines 22 overlap the underlying magnetic memory element 14 on each side by the width of the minimum feature size F.

Forming a gap 44 in the second conductive lines 22 in accordance with embodiments of the present invention interrupts the wordline 22 above the magnetic memory cell 14 and forces the wordline 22 current 28 to pass through the free layer 20 from one end (in the left side of FIG. 2, along one-third of the length of the cell 14) to the other end of the free layer 20, where the next wordline 22 strip or segment picks the current 28 up again (e.g., in the right side of FIG. 2).

Preferably, the tunnel barrier 18 has a high enough resistance so that substantially no leakage current flows through the tunnel barrier 18. Thus, in accordance with embodiments of the invention, due to the novel non-continuous shape of the second conductive lines or wordlines 22, the wordline current 28 is adapted to be used as heat current 28a for the free layer 20 (e.g. second material 26 of the magnetic memory cells 14.

Figure 3:
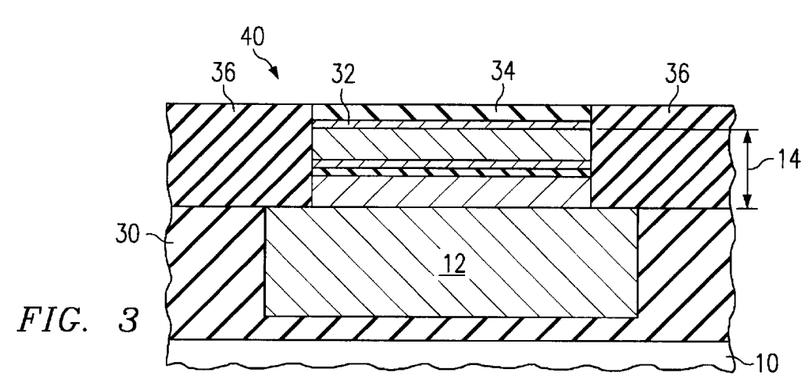
FIGS. 3 through 5 show cross-sectional views of an MRAM device at various stages of fabrication in accordance with an embodiment of the invention.
Figure 4:
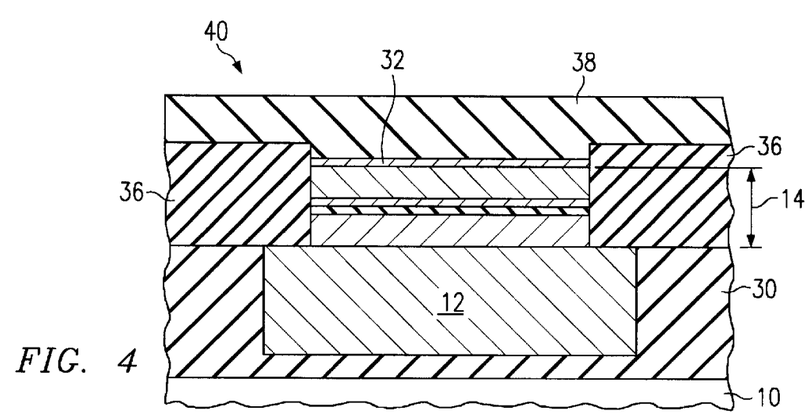
Figure 5:
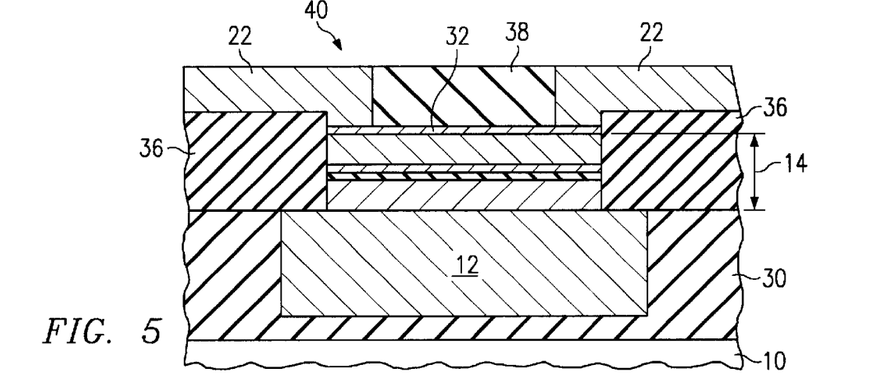

In order to create the gaps 44 in the wordline 22 over each cell 14, preferably an etch stop layer 32, also referred to herein as a cap layer 32, is used to protect the free layer 20 from the etch process, as shown in FIGS. 3 through 5 (The free layer 20 is not shown in FIGS. 3 through 5, yet free layer 20 is part of the magnetic memory cell 14: see FIG. 2). Preferably, because the etch stop layer 32 is disposed between the cell 14 and the wordline 22, the etch stop layer 32 is conductive, allowing electrical contact between the cell 14 and the wordline 22. Consequently, not all of the wordline 22 current 28 (of FIG. 2) flows through the free layer 20: a small amount of current 28b bypasses the free layer 20 through the etch stop layer 32. Advantageously, this bypass current 28b generates a small hard axis field for the magnetic memory cell 14 which may be used to write the cell 14.

Therefore, in accordance with embodiments of the invention, the wordline current 28 is used both as a heat current 28a and as a hard axis field-generating write current 28b. To achieve this, preferably the free layer 20 comprises a material that changes its magnetic properties strongly with temperature in the range of room temperature up to 400 degrees C. Referring again to FIG. 2, for example, preferably the free layer 20 second material 26 comprises a ferromagnetic material with a relatively low Curie temperature $T_C$, such as alloys of ferromagnetic elements with non-ferromagnetic elements, such as alloys of Co or Ni with Cr, Mn, V or combinations thereof, as examples. Lowering the Curie temperature by combining ferromagnetic elements with non-ferromagnetic elements also lowers the saturation magnetization.

Because when used as a single layer, such alloys tend to show little tunnel resistance change for different orientations with respect to the reference layer 16, preferably the free layer 20 comprises a double layer comprising a first layer 24 and second layer 26 in accordance with embodiments of the present invention. The first layer 24 preferably comprises a thin layer, e.g., 8 Angstroms of a high Curie temperature material, e.g., having a $T_C$ of greater than 420 degrees C., disposed over and in contact with the tunnel barrier 18. For example, the first material may comprise permalloy, Co or CoFe, as examples. The second layer 26 preferably comprises a relatively thick ferromagnetic alloy layer, e.g., 50–100 Angstroms of a low Curie temperature, e.g., having a $T_C$ of approximately room temperature to 400 degrees C.

By sending a current pulse 28 through the wordline 22, all cells 14 on that wordline 22 are heated to close or above the Curie temperature of the low Curie temperature second layer 26. Heating the second material 26 to a temperature close to or above the Curie temperature of the second material causes the second material 26 to lose its ferromagnetic properties. Because the magnetization of the low-$T_C$ second material layer 26 has now been reduced or eliminated, only the magnetization of the very thin high-$T_C$ first material layer 24 is required to be switched by the fields generated by the bitline 12 (see FIG. 3) and the small wordline 20 bypass currents.

The high-$T_C$ second layer 26 can be made as soft (in magnetic terms) as possible without risking the generation of soft errors because the low-$T_C$ layer 26 hinders all half-select cells on the bitline 12 from thermally-activated switching. Because all cells 14 on the wordline 22 are heated, and the resistance of the wordline 22 is relatively high due to the relatively high free layer resistance, for example, approximately 30 Ohm per tunnel junction 14, the wordline 22 is preferably only as long as the word length (e.g. 16 or 32 cells 14).

In accordance with embodiments of the invention, as an example, for 100 nm wide cells 14 having an 8 nm thick free layer 20, a wordline 22 current pulse 28 of approximately 1 mA for 10 ns increases the temperature of the free layer 20 by approximately 200 degrees C., for example. This would be a sufficient current to provide thermal write selectivity, if a second material 26 comprises a Curie temperature of approximately 200 degrees C. or lower. For short current pulses, heat dissipation is negligible, although a short cooling period may be required for the wordline 22.

In accordance with an embodiment of the invention, a current 28 passed through the wordline 22 passes through both the second magnetic material 26 as a heat current 28a and also through the cap layer 32 as write current 28b, as shown in FIG. 2. The second magnetic material 26 comprises a resistance R, such that the second magnetic material 26 is heated. Heating the second magnetic material 26 above the Curie temperature of the second magnetic material 26 causes the second material to lose its ferromagnetic properties. By proper tuning of the specific resistance of the etch stop layer 32, only about 10 to 20% of the wordline 22 current 28 will bypass the free layer 20 through the approximately 10 nm thick etch stop layer 32. Because the high-$T_C$ first material layer 24 can be made very soft, only about 2 to 3 mA will be sufficient for the bitline current, rather than 10 to 15 mA which is typically needed in the prior art for such small cells 14. Preferably, the cells 14 will be cooled down before the writing of other cells 14 on the same bitline 12 will transpire.

Embodiments of the present invention reduce the overall required write currents for the wordline 22 and bitlines 12. The write margin is increased, because the half select cells on the bit line will only see about 20% of their switching field.

Two examples for fabricating wordlines with gaps will next be described.

EXAMPLE 1

FIGS. 3 through 5 show cross-sectional views of an MRAM device 40 at various stages of fabrication in accordance with an embodiment of the invention. FIG. 3 shows a semiconductor wafer including a workpiece 10. The workpiece 10 may include a semiconductor substrate comprising silicon or other semiconductor materials covered by an insulating layer, for example. The workpiece 10 may also include other active components or circuits formed in the front end of the line (FEOL), not shown. The workpiece 10 may comprise silicon oxide over single-crystal silicon, for example. The workpiece 10 may include other conductive layers or other semiconductor elements, e.g. transistors, diodes, etc. Compound semiconductors such as GaAs, InP, or SiC, or Si/Ge, as examples, may be used in place of silicon.

A first insulating layer 30 is deposited over the workpiece 10. The first insulating layer 30 preferably comprises an inter-level dielectric (ILD) layer, e.g., the wafer first inter-level dielectric. The first insulating layer 30 preferably comprises silicon dioxide ($SiO_2$) and may alternatively comprise other dielectric materials such as low dielectric constant materials, for example.

The first insulating layer 30 is patterned, etched, and filled with a conductive material to form first conductive lines 12, e.g., using a damascene process. The pattern and fill process may comprise a single damascene or dual-damascene process, with vias (not shown) being filled at the same time first conductive lines 12 are filled, not shown, for example. The first insulating layer 30 may be lithographically patterned and reactive ion etched (RIE) to form trenches where first conductive lines 12 will be formed. The trenches may be 0.2 $\mu$m wide and 0.4 to 0.6 $\mu$m deep, as examples.

Depending on the conductive material used, conductive lines 20 may include an optional liner, not shown. Conductive material is then deposited over the wafer 10 and within the trenches. First conductive lines 12 may comprise minimum pitched lines (e.g., having the smallest feature size) or larger pitched lines. The wafer 10 is planarized, with a chemical-mechanical polish (CMP) process, for example, to remove the excessive conductive material 12 from above the top surface of the first insulating layer 30.

The first conductive lines 12 preferably comprise a conductive material preferably comprising a metal such as copper, and alternatively comprising other conductive materials such as Al, TiN, Ti, W, combinations thereof, or other conductive materials, deposited by physical vapor deposition (PVD) or chemical vapor deposition (CVD), as examples. First conductive lines 12 may be part of an M1 or M2 metallization layer, as examples.

The various material layers of the magnetic memory cells 14 are deposited, as described earlier herein. A cap layer or etch stop layer 32 is deposited over the magnetic memory cell 14 material. The cap layer 32 preferably comprises approximately 10 nm of a material such as WN, TiN or TaN, as examples, as described in related U.S. patent application, Ser. No. 10/124,950 entitled "Material Combinations for Tunnel Junction Cap Layer, Tunnel Junction Hard Mask and Tunnel Junction Stack Seed Layer in MRAM processing," filed on Apr. 18, 2002 by Leuschner et al., which is incorporated herein by reference.

A hard mask material 34 is disposed over the cap layer 32. The hard mask 34 is also referred to herein as a tunnel junction (TJ) hard mask. The hard mask material 34 and cap layer 32 preferably comprise different materials, and the hard mask material 34 may comprise WN, TiN, TaN, amorphous carbon with hydrogen (amorphous carbon with, for example, 0–40% hydrogen), or $SiO_2$, as examples.

A tunnel junction isolation layer 36 is deposited, which may comprise $Si_3N_4$, for example. The wafer is planarized, and excess portions of the isolation layer 36 are removed, for example, with a chemically-mechanically polish (CMP) process.

In this example, as shown in FIG. 4, the remaining TJ hard mask 34 is removed using oxygen or fluorine chemistries, as examples, stopping on the etch stop layer 32 (e.g., if the etch stop layer 32 comprises TiN, which is resistant to fluorine chemistry). An insulating layer 38 is deposited, which may comprise an inter-layer dielectric such as silicon oxide, for example. Using a damascene process, the insulating layer 38 is patterned and etched in the pattern of wordlines 22 which are then formed. The etch process for the insulating layer 38 may comprise a fluorine chemistry, for example, which is adapted to stop on the etch stop or cap layer 32. A liner (not shown) and a conductive material such as copper are deposited to fill in the trenches, as shown in FIG. 5, as in typical damascene techniques.

EXAMPLE 2

Figure 6:
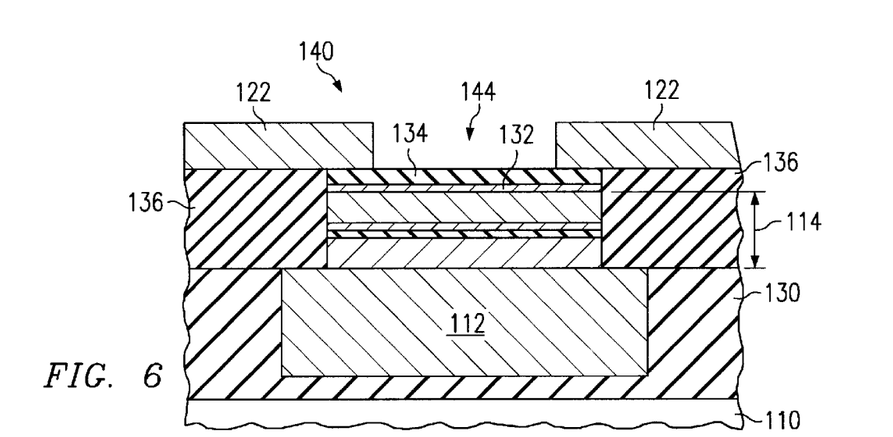
FIGS. 6 and 7 show cross-sectional views of an MRAM device at various stages of fabrication in accordance with another embodiment of the invention.
Figure 7:
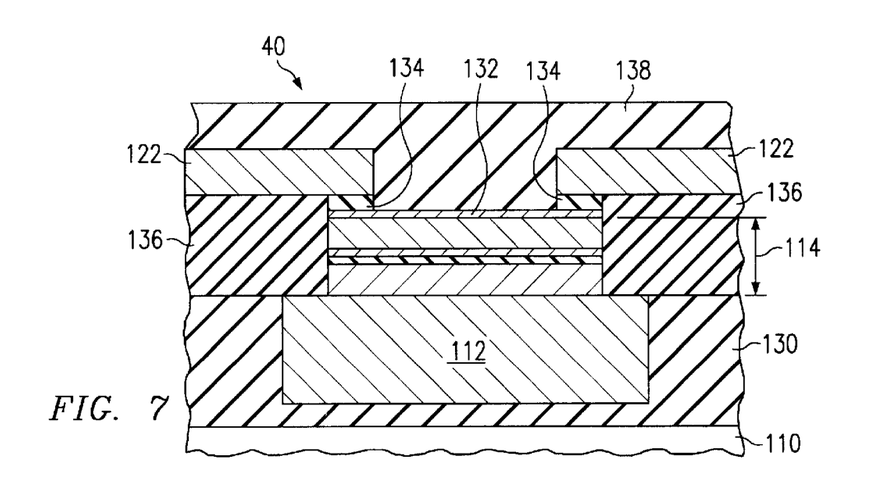

FIGS. 3, 6, and 7 illustrate a second example of a process flow for an embodiment of the present invention. In this embodiment, second conductive lines 122 are formed by patterning a deposited conductive material, rather than by a damascene process, and portions of the hard mask 134 are not removed.

After the tunnel junction isolation layer 36 has been deposited and planarized, as shown in FIG. 3, the conductive material for the second conductive lines 122 comprising a conductor such as aluminum, as an example, is deposited and patterned, as shown in FIG. 6. The conductive material etch process may comprise a chlorine chemistry, for example, which may be adapted to stop on the TJ isolation material 136 and in the gap 144 on the hard mask 134. In this example, the hard mask 134 preferably comprises W or WN, as examples.

Portions of the hard mask 134 may be etched in the gap 144, for example, using a fluorine chemistry, wherein the etch process is adapted to stop on the etch stop or cap layer 132 layer, as shown in FIG. 7. In this embodiment, preferably, the cap layer 132 comprises TiN, for example. Next, an insulating layer 138 which may comprise an interlevel dielectric, for example, is deposited and polished by CMP, as shown.

Figure 8:
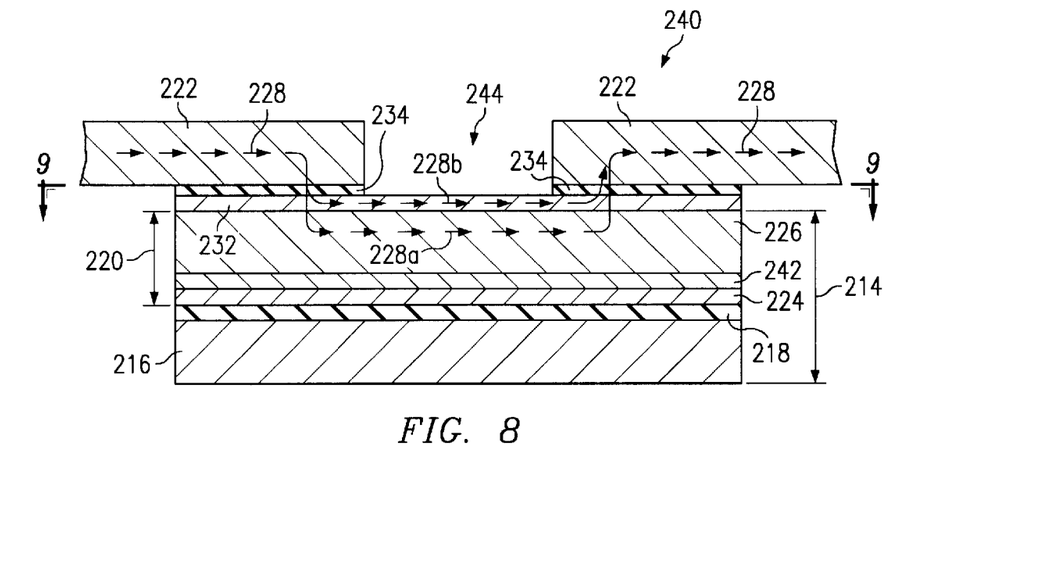
FIG. 8 shows a cross-sectional view of an embodiment of the invention including a cap layer and hard mask.

FIG. 8 shows a cross-sectional view of another embodiment of the present invention, wherein the MRAM device 240 includes a soft layer 220 having a first material 224 adjacent the tunnel junction or insulating layer 218, a third material 242 adjacent the first material 224, and a second material 226 adjacent the third material 242. The cap layer 232 is formed over the second layer 226, as shown, and portions of the hard mask 234 remain beneath the second conductive line 222 strips that make contact to the magnetic memory cells 214.

The third material 242 preferably comprises a magnetic material, such as Ru. The third material 242 functions as a coupling material between the first magnetic material 224 and the second magnetic material 226, for example. For anti-parallel coupling, preferably the third material 242 is relatively thin, such as 9 to 10 Angstroms, as an example. For parallel coupling, the third material 242 may be thicker, such as 12 to 15 Angstroms, as an example.

FIG. 8 also illustrates a current 228 being passed through the wordline 222 which in turn passes through the second magnetic material 226 as heat current 228a and through the cap layer 232 as write current 228b.

Figure 9:
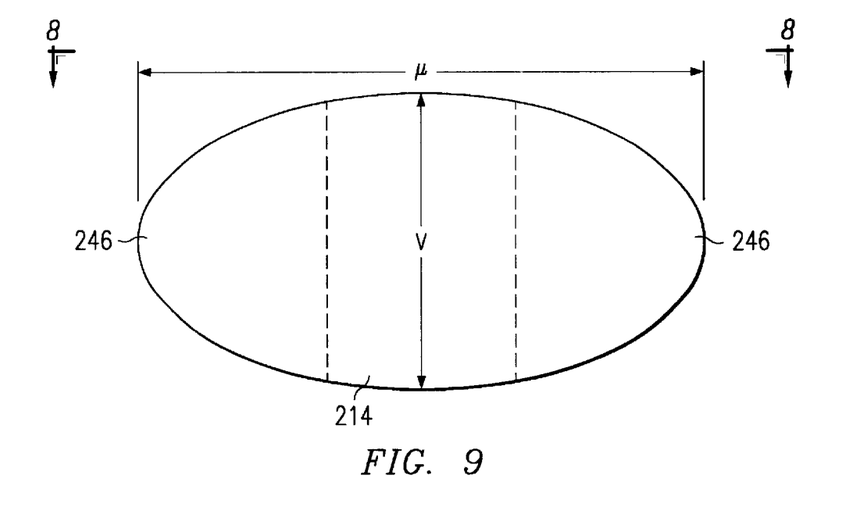
FIG. 9 shows a top view of the magnetic memory cell shown in FIG. 8.

FIG. 9 shows a top view of the magnetic memory cell 214 shown in FIG. 8. The memory cell 214 preferably has an elliptical shape, as shown, having a long axis "u" and a short axis "v". In accordance with a preferred embodiment of the invention, preferably, the long axis "u" is at least approximately three times longer than the short axis "v", as shown, for example. Areas 246 indicate regions where the second conductive lines 228 overlap and make electrical contact to the magnetic memory cell 214.

Another embodiment of the present invention includes a method of fabricating a resistive semiconductor memory device, comprising providing a workpiece, disposing a plurality of first conductive lines over the workpiece, and forming a plurality of magnetic memory cells over the first conductive lines. Forming the magnetic memory cells includes forming a first magnetic layer over the first conductive lines, forming a tunnel barrier layer over the first magnetic layer, depositing a second magnetic layer first material over the tunnel barrier, and depositing a second magnetic layer second material over the second magnetic layer first material, wherein the second magnetic layer second material has a lower Curie temperature than the Curie temperature of the second magnetic layer first material. The method includes forming a plurality of second conductive lines over the magnetic memory cells, wherein the second conductive lines are non-continuous and have gaps over central portions of the magnetic memory cells.

In one embodiment, the magnetic memory cells have a length, wherein forming a plurality of second conductive lines comprises coupling a non-continuous portion of each second conductive line to a magnetic memory cell over approximately one-third of the magnetic memory cell length. Depositing a second magnetic layer second material may comprise depositing a thicker material thicker than the second magnetic layer first material. More particularly, depositing a second magnetic layer second material may comprise depositing a material at least five times thicker than the second magnetic layer first material. The method may include disposing a third material between the second magnetic layer first material and the second magnetic layer second material, wherein the third material is non-magnetic. The method may further include depositing a cap layer over the second magnetic layer second material, and depositing a hard mask material over the cap layer. Furthermore, the method may include patterning the hard mask material to form a hard mask, and using the patterned hard mask to pattern the cap layer, second magnetic layer, and tunnel barrier layer to form a plurality of tunnel junctions.

Another embodiment of the invention includes a method of writing to an magnetic random access memory (MRAM) device, comprising providing a MRAM device comprising an array of magnetic memory cells disposed over a plurality of first conductive lines, the memory cells including a soft layer including a first magnetic material and a second magnetic material disposed over the first magnetic material, the second magnetic material having a lower Curie temperature than the first magnetic material, the MRAM device including a plurality of non-continuous second conductive lines disposed over the magnetic memory cells. The method includes running a heat current through at least a portion of one of the second conductive lines through the second magnetic material of at least one of the magnetic memory cells, wherein the heat current increases the temperature of the second magnetic material. Running the heat current may comprise applying a voltage to the second conductive line, for example. Running a heat current through the second magnetic material preferably increases the temperature of the second magnetic material to a temperature higher than the second magnetic material Curie temperature.

Embodiments of the present invention achieve technical advantages by providing an increased write margin to magnetic memory cells 14/114/214 along a wordline 22/122/222 by using a heat current 28a/128a/228a to heat the soft layer second layer 26/126/226 of the memory cells 14/114/214. A row of memory cells 14/114/214 may be thermally selected, using the soft or free layer 20/120/220 as a resistive heating element. No additional wiring or material layers are necessary in accordance with embodiments of the invention. The heat current 28a/128a/228a is applied to the wordline 22/122/222 row using the second conductive lines 22/122/222, e.g., wordlines disposed adjacent the soft layer. A cap layer 32/132/232 may be disposed over the memory cells 14/214/214 through which a portion 28b/128b/228b of the current 28/128b/228b may be run, to provide the write current for the magnetic memory cells. The required write currents 28b/128b/228b for both wordlines and bitlines are reduced in accordance with embodiments of the invention.

Embodiments of the present invention are described with reference to a particular application for cross-point MRAM devices shown herein; however, embodiments of the invention also have application in other MRAM device designs and other resistive semiconductor devices.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A resistive semiconductor memory device, comprising:
   a plurality of first conductive lines running in a first direction;
   a plurality of magnetic memory cells disposed over the first conductive lines; and
   a plurality of second conductive lines running in a second direction disposed over the magnetic memory cells, the second direction being different from the first direction, wherein each of the second conductive lines is non-continuous and said second conductive lines comprise a gap over a center portion of each magnetic memory cell.

2. The resistive semiconductor memory device according to claim 1, wherein the magnetic memory cells include a first magnetic layer disposed over the first conductive lines, a tunnel barrier disposed over the first magnetic layer, and a second magnetic layer disposed over the tunnel barrier, the second magnetic layer comprising a first material and a second material disposed over the first material, the second material having a lower Curie temperature than the Curie temperature of the first material, wherein the second conductive lines are coupled to the magnetic memory cell second magnetic layer.

3. The resistive semiconductor memory device according to claim 1, wherein each second conductive line is patterned to connect adjacent magnetic memory cells.

4. The resistive semiconductor memory device according to claim 3, wherein the magnetic memory cells have a length, wherein each second conductive line is coupled to a magnetic memory cell over approximately one-third of a magnetic memory cell length.

5. The resistive semiconductor memory device according to claim 2, wherein the second material is thicker than the first material.

6. The resistive semiconductor memory device according to claim 5, wherein the second material is at least five times thicker than the first material.

7. The resistive semiconductor memory device according to claim 2, wherein each second conductive line comprises a plurality of strips, a first end of each strip being coupled to an edge of a first magnetic memory cell, a second end of each strip being coupled to an edge of a second magnetic memory cell adjacent tie first magnetic memory cell.

8. The resistive semiconductor memory device according to claim 5, wherein the second material comprises ferromagnetic properties, wherein a current run through one of the second conductive lines is adapted to heat the second material to a temperature greater than the Curie temperature of the second material, causing the second material to lose its ferromagnetic properties.

9. The resistive semiconductor memory device according to claim 2, further comprising a cap layer disposed over the magnetic memory cells.

10. The resistive semiconductor memory device according to claim 9, wherein the cap layer comprises TaN or TiN.

11. The resistive semiconductor memory device according to claim 9, wherein the second material comprises ferromagnetic properties, wherein a current run through one of the second conductive lines is adapted to flow through the second material and heat the second material to a temperature greater than the Curie temperature of the second material, and the current run through one of the second conductive lines is further adapted to run through the cap layer and comprises a write current.

12. The resistive semiconductor memory device according to claim 9, further comprising a hard mask disposed over the cap layer.

13. The resistive semiconductor memory device according to claim 12, wherein the hard mask comprises amorphous carbon including 0–40% of hydrogen, $SiO_2$, W or WN.

14. The resistive semiconductor memory device according to claim 1, wherein the resistive semiconductor memory device comprises a cross-point magnetic random access memory (MRAM) device.

15. The resistive semiconductor memory device according to claim 2, further comprising a third material disposed between the first material and the second material, wherein the third material comprises a non-magnetic material.

16. A method of writing to an magnetic random access memory (MRAM) device, comprising:
   providing a MRAM device comprising an array of magnetic memory cells disposed over a plurality of first conductive lines, the memory cells including a soft layer including a first magnetic material and a second magnetic material disposed over the first magnetic material, the second magnetic material having a lower Curie temperature than the first magnetic material, the MRAM device including a plurality of non-continuous second conductive lines disposed over the magnetic memory cells, wherein at least one said second conductive lines comprises a gap over a center portion of each magnetic cell; and running a heat current through at least a portion of one of the second conductive lines through the second magnetic material of at least one of the magnetic memory cells, wherein the heat current increases the temperature of the second magnetic material.

17. The method according to claim 16, wherein running a heat current comprises applying a voltage to the second conductive line.

18. The method according to claim 16, wherein running a heat current through the second magnetic material increases the temperature of the second magnetic material to a temperature higher than the second magnetic material Curie temperature.

19. The method according to claim 16, wherein the MRAM device further comprises a cap layer disposed over the second magnetic material, wherein running a heat current comprises running a write current through the cap layer.

20. The method according to claim 16, further comprising running a heat current through the second magnetic material of each memory cell coupled to a single second conductive line.

* * * * *